(12) United States Patent
Yamaguchi

(10) Patent No.: US 10,154,600 B1
(45) Date of Patent: Dec. 11, 2018

(54) COVER LOCKING STRUCTURE OF ELECTRICAL JUNCTION BOX

(71) Applicant: YAZAKI CORPORATION, Tokyo (JP)

(72) Inventor: Makoto Yamaguchi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/059,024

(22) Filed: Aug. 8, 2018

(30) Foreign Application Priority Data

Sep. 15, 2017 (JP) .................. 2017-177965

(51) Int. Cl.
*H05K 5/00* (2006.01)
*H05K 5/02* (2006.01)
*H02G 3/08* (2006.01)

(52) U.S. Cl.
CPC ........... *H05K 5/0221* (2013.01); *H02G 3/081* (2013.01)

(58) Field of Classification Search
CPC .............................. H05K 5/0221; H02G 3/081
See application file for complete search history.

(56) References Cited

U.S. PATENT DOCUMENTS

| 4,840,286 | A | * | 6/1989 | Heberling | ............ | H05K 5/0013 |
| | | | | | | 220/4.02 |
| 5,931,514 | A | * | 8/1999 | Chung | .................. | F16B 12/26 |
| | | | | | | 220/326 |
| 7,413,479 | B1 | * | 8/2008 | Volpone | ................ | H01R 13/506 |
| | | | | | | 174/138 F |
| 7,553,180 | B2 | * | 6/2009 | Hu | .......................... | E05C 19/06 |
| | | | | | | 220/284 |
| 7,578,710 | B2 | * | 8/2009 | Koelle | .................... | G01R 1/203 |
| | | | | | | 439/762 |
| 8,648,264 | B2 | * | 2/2014 | Masumoto | ........... | H02G 3/0675 |
| | | | | | | 174/50 |
| 9,226,412 | B2 | * | 12/2015 | Pinol Pedret | ......... | H01M 10/48 |
| 9,609,763 | B2 | * | 3/2017 | Gerst | ....................... | E05C 19/06 |
| 9,686,877 | B2 | * | 6/2017 | Tokumasu | ............ | H05K 5/0221 |
| 9,831,647 | B2 | * | 11/2017 | Kakoi | ..................... | B60R 16/02 |
| 2002/0134572 | A1 | | 9/2002 | Matsumura | | |
| 2008/0050985 | A1 | * | 2/2008 | Roset | ................. | G01R 31/3696 |
| | | | | | | 439/754 |
| 2017/0117108 | A1 | * | 4/2017 | Richardson | ........ | H05B 37/0236 |
| 2018/0159306 | A1 | * | 6/2018 | Nakashima | .......... | H05K 5/0073 |

FOREIGN PATENT DOCUMENTS

JP 5-55721 U 7/1993
JP 2002-289171 A 10/2002

* cited by examiner

*Primary Examiner* — Hung V Ngo
(74) *Attorney, Agent, or Firm* — Kenealy Vaidya LLP

(57) ABSTRACT

A cover locking structure includes a covered body and a cover. The covered body includes a locked surface part which is parallel to a covered surface. The cover includes an operation part and a lock piece having a locking surface part to be locked with the locked surface part. The lock piece has a taper part formed by notching an operation part side of an edge part gradually larger toward the operation part.

3 Claims, 6 Drawing Sheets

COVER LOCKING STRUCTURE OF ELECTRICAL JUNCTION BOX

CROSS-REFERENCES TO RELATED APPLICATIONS

This application is based on and claims priority from Japanese Patent Applications No. 2017-177965 filed on Sep. 15, 2017, the entire contents of which are incorporated herein by reference.

BACKGROUND

1. Field of the Invention

The invention relates to a cover locking structure of an electrical junction box.

2. Description of Related Art

What is disclosed in Patent Document 1 or 2 is a battery cover or a fuse cover with which an upper part of an electrical junction box such as a fuse unit is covered for waterproof and dustproof purposes. In the electrical junction box of Patent Document 1, frame-shaped protrusions formed on both side surfaces of the fuse cover are locked to locking protrusions formed on both side surfaces of a fuse mounting part, and the fuse cover is held in the electrical junction box. In the battery cover of Patent Document 2, lock parts formed on side walls of both sides of a first cover are engaged with recesses of side walls of the fuse unit, thereby fixing the first cover to the fuse unit. A second cover for a connecting operation of a terminal or visually identifying a fuse is attached to the first cover openably and closably through a hinge part, thus enabling good maintenance.

In the conventional cover locking structure, it is required to detach the whole cover from the fuse unit by unlocking locking parts of the cover for maintenance etc. of a vehicle. For example, according to the battery cover of Patent Document 2, the second cover can easily be unlocked without being influenced by an environment of the periphery of the fuse unit. On the other hand, in order to to detach the first cover, time and effort are required to push the opposed locking parts in a separation direction by both hands of a worker, and space for the worker to put the hands is required on the periphery. The same applies to the case of the fuse cover in the electrical junction box of Patent Document 1. As a result, the conventional cover locking structure has a problem of being difficult to do work of detaching the cover in the case where the periphery has space limitations.

Patent Document 1: JP-U-05-055721
Patent Document 2: JP-A-2002-289171

SUMMARY

In accordance with a cover locking structure of an electrical junction box of exemplary embodiments, a space for enabling worker's hands to access around a cover is unrequired in order to detach the cover.

According to exemplary embodiments, a cover locking structure of an electrical junction box includes a covered body and a cover.

The covered body includes a first side surface part which is perpendicular to a covered surface of the covered body. The covered body also includes a second side surface part which is parallel to the first side surface. In addition, the covered body includes at least one locked surface part which is provided on each of the first side surface part and the second side surface part and is parallel to the covered surface.

The cover includes a first side wall which is extended from a top wall configured to cover the covered surface and is opposed to the first side surface part. The cover also includes a second side wall which is extended from the top wall and is opposed to the second side surface part.

The cover also includes an operation part projected on a third side wall between the first side wall and the second side wall. Moreover, the cover includes a plurality of lock pieces provided on the first side wall and the second side wall.

Each of the plurality of lock pieces includes a locking surface part to be locked with a corresponding one of the locked surface parts.

A lock piece which is nearest to the operation part among the plurality of lock pieces has a taper part formed by notching an operation part side of an edge part gradually larger toward the operation part.

The edge part is located between the locking surface part and a projection end face part perpendicular to the locking surface part.

Other aspects and advantages of the invention will be apparent from the following description and the appended claims.

DETAILED DESCRIPTION

Exemplary embodiments of the invention will hereinafter be described with reference to the drawings.

Figure 1:
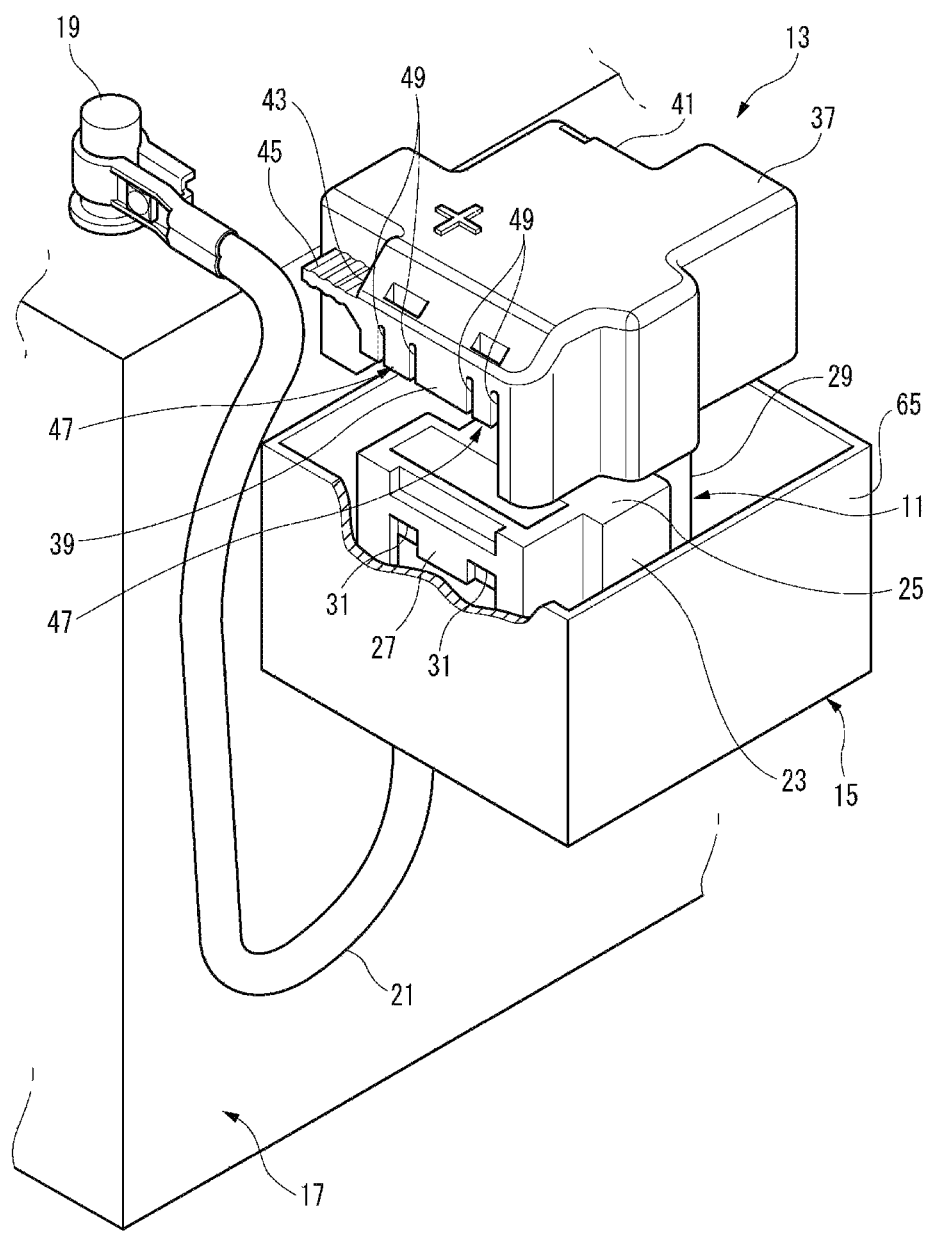
FIG. 1 is an exploded perspective view showing a covered body and a cover including a cover locking structure of an electrical junction box according to one embodiment.

FIG. 1 is an exploded perspective view showing a fuse unit 11 and a fuse cover 13 including a cover locking structure of an electrical junction box according to one embodiment.

The cover locking structure of the electrical junction box according to the present embodiment mainly has a cover and a covered body installed inside the electrical junction box.

In the embodiment, the covered body installed inside a fuse box 15 as the electrical junction box is the fuse unit 11, and the cover is the fuse cover 13. In addition, the covered body, the cover and the electrical junction box according to the invention are not limited to these. In the cover locking structure of the electrical junction box according to the invention, the covered body may be, for example, a bus bar unit or a relay unit. Also, the electrical junction box may be, for example, a joint box, a relay box, or a box body with the joint box and the relay box mixed.

As shown in FIG. 1, the fuse unit 11 is a unit for connecting a battery 17 to a plurality of electric wires (not shown) for supply of a power source. The battery 17 has a pair of battery posts 19 of a positive electrode and a negative electrode. A power source line 21 connected to the battery posts 19 of the positive electrode is connected to the fuse unit 11 of the inside of the fuse box 15. That is, the fuse unit 11 is a fusible link unit constructed of, for example, a plate-shaped fuse element made of a conductive metal including a plurality of fuses, and a resin body with electrical insulation properties formed by insert molding of the fuse element.

The fuse unit 11 has a unit housing 23 molded by a resin with electrical insulation properties. An upper surface of the unit housing 23 forms a covered surface 25 covered by attaching the fuse cover 13. In the embodiment, the covered surface 25 forms the covered surface in which a plurality of fuses are arranged. The fuse unit 11 has a first side surface part 27 and a second side surface part 29 (see FIG. 2) which are mutually in parallel and are vertical to the covered surface 25, on the unit housing 23. Each of the first side surface part 27 and the second side surface part 29 is formed with at least one locked surface part 31 (see FIG. 6) parallel to the covered surface 25. In the embodiment, the first side surface part 27 is provided with the two locked surface parts 31, and the second side surface part 29 is provided with the one locked surface part 31, and the sum of the locked surface parts 31 is three. The locked surface part 31 can be constructed by, for example, an upper surface of the inside of a recess 33 formed in each of the first side surface part 27 and the second side surface part 29.

Figure 2A:
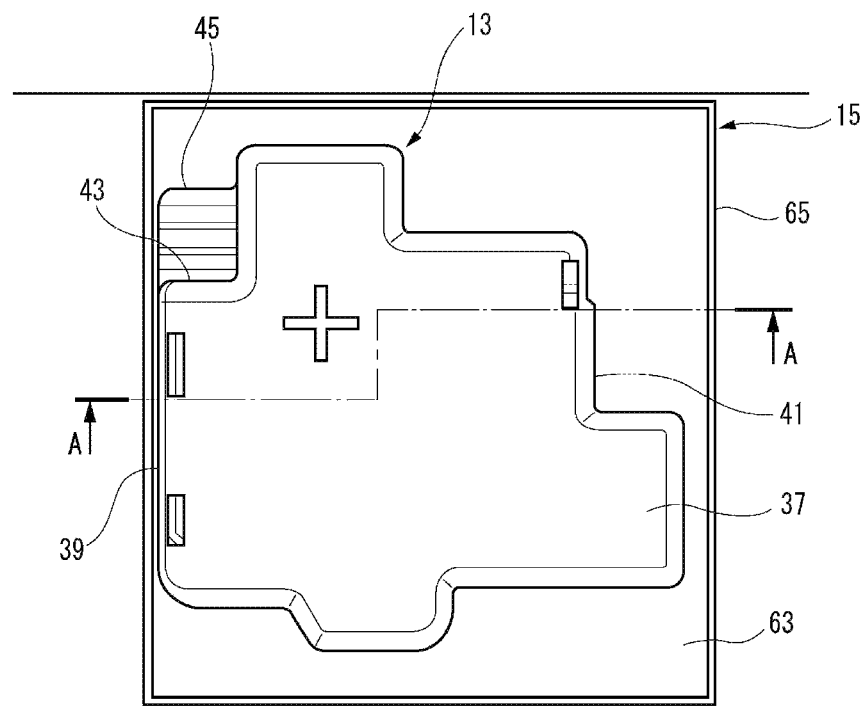
FIG. 2A is a plan view of the electrical junction box shown in FIG. 1.
Figure 2B:
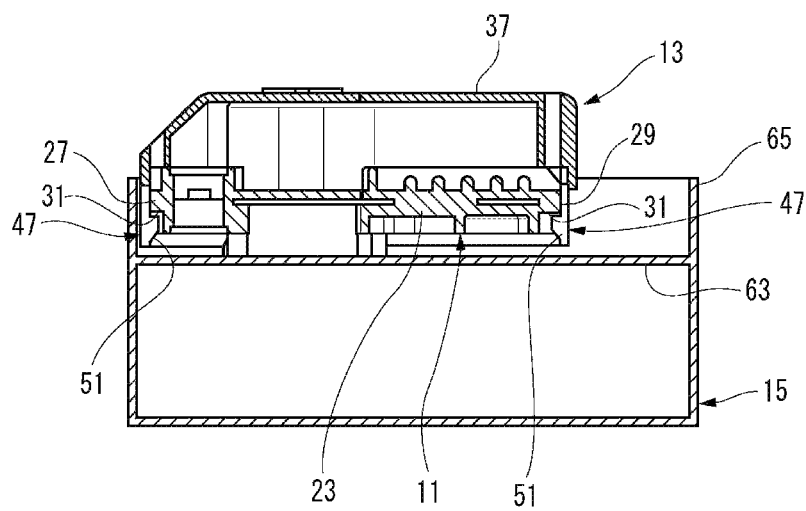
FIG. 2B is a sectional view taken on line A-A in FIG. 2A.
Figure 3A:
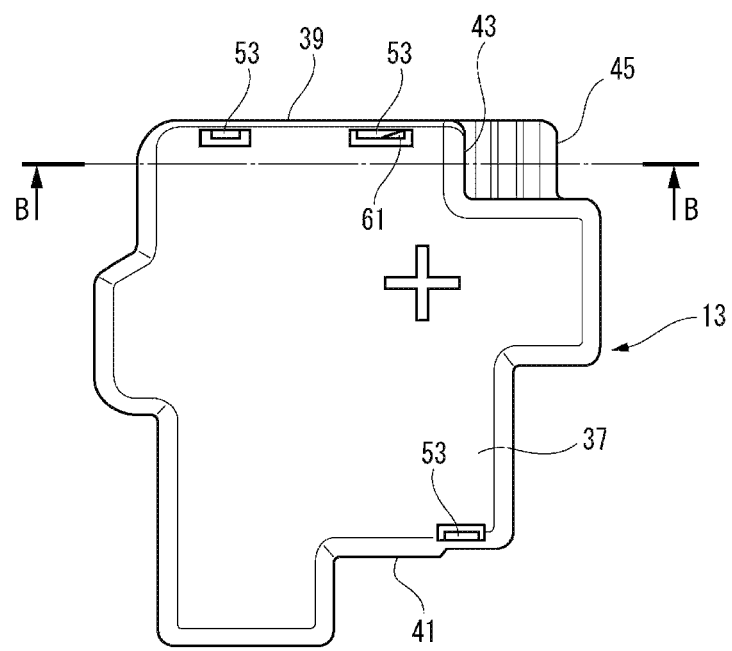
FIG. 3A is a plan view of the cover shown in FIGS. 2A and 2B.
Figure 3B:
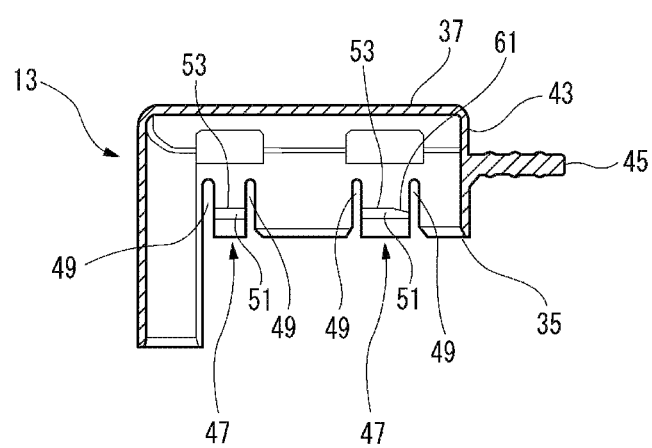
FIG. 3B is a sectional view taken on line B-B in FIG. 3A.

FIG. 2A is a plan view of the fuse box 15 shown in FIG. 1, and FIG. 2B is a sectional view taken on line A-A in FIG. 2A, and FIG. 3A is a plan view of the cover shown in FIGS. 2A and 2B, and FIG. 3B is a sectional view taken on line B-B in FIG. 3A.

The fuse cover 13 is formed in a box shape with an opening part 35 (see FIG. 3B) formed in a lower surface. This opening part 35 of the fuse cover 13 covers the unit housing 23, and covers the covered surface 25. The fuse cover 13 is molded of a soft resin, and has a certain level of softness. This softness allows the fuse cover 13 to be totally elastically deformed by an opening/closing operational force applied to the fuse cover 13.

The fuse cover 13 has a parallel top wall 37 covering the covered surface 25 of the fuse unit 11. A first side wall 39 and a second side wall 41 respectively opposed to the first side surface part 27 and the second side surface part 29 of the fuse unit 11 are extended on both sides of the top wall 37. The fuse cover 13 forms a third side wall 43 between the first side wall 39 and the second side wall 41. An operation part 45 is projected on this third side wall 43. The operation part 45 is formed in a tab shape, easy to hook a finger, projected from the third side wall 43 in parallel with the top wall 37. The operation part 45 is formed so as to apply a pull-up force to the fuse cover 13, for example, by hooking a forefinger downwardly.

The first side wall 39 and the second side wall 41 of the fuse cover 13 are formed with a plurality of lock pieces 47. A locking surface part 53 of a lock claw 51 of the lock piece 47 is locked into each of the locked surface parts 31 of the fuse unit 11 described above. The lock pieces 47 can be formed on the first side wall 39 and the second side wall 41 by any number. In the embodiment, according to the number of locked surface parts 31, the first side wall 39 is provided with the two lock pieces 47, and the second side wall 41 is provided with the one lock piece 47, and the sum of the lock pieces 47 is three.

Figure 4A:
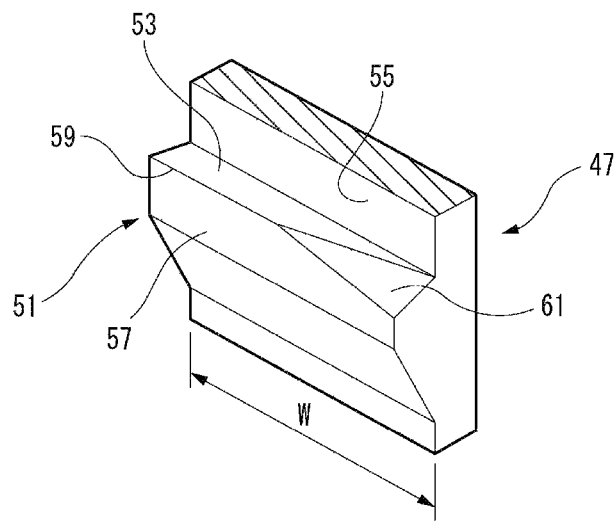
FIG. 4A is a main enlarged perspective view of a lock piece shown in FIG. 3B.
Figure 4B:
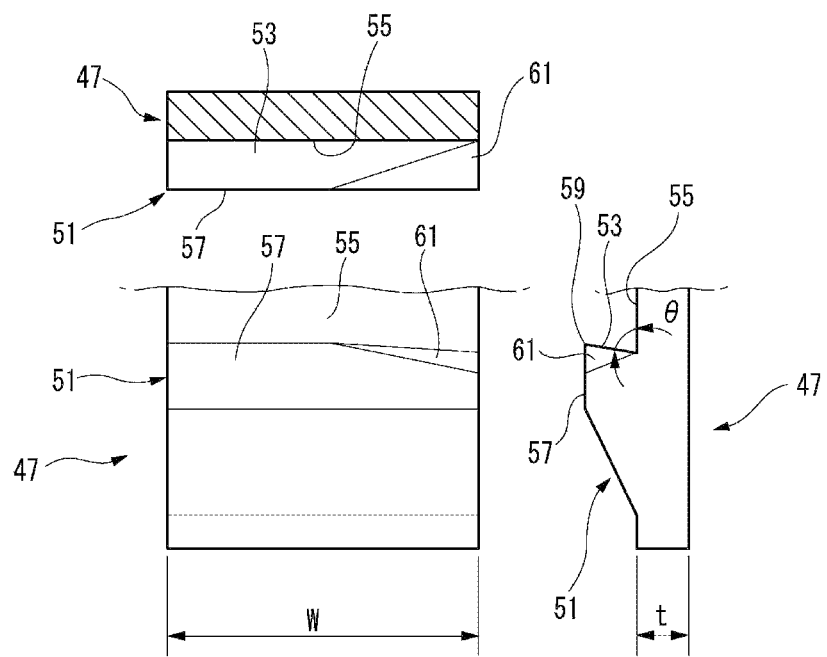
FIG. 4B is a three-sided view including a plan view, a front view and a side view of the lock piece shown in FIG. 4A.

FIG. 4A is a main enlarged perspective view of the lock piece 47 shown in FIG. 3B, and FIG. 4B is a three-sided view including a plan view, a front view and a side view of the lock piece 47 shown in FIG. 4A.

The lock piece 47 is a flexible piece with a lower end (opening part side end) formed as a free end by forming a pair of parallel slits 49 (see FIG. 3B) from the opening part side of each of the first side wall 39 and the second side wall 41.

As shown in FIG. 4A, the lock claw 51 of the lock piece 47 is projected on the surface side in this lower end, opposed to each of the first side surface part 27 and the second side surface part 29 of the fuse unit 11. The lock claw 51 has the locking surface part 53. This locking surface part 53 is formed in parallel with or at an acute angle with respect to the locked surface part 31 formed on the fuse unit 11. Here, a state of parallel with the locked surface part 31 means that the locking surface part 53 is vertical to a plate surface 55 of the lock piece 47. Also, the locking surface part 53 with the acute angle means that an angle θ between the locking surface part 53 and the plate surface 55 of the lock piece 47 is the acute angle.

The lock claw 51 has an edge part 59 located between the locking surface part 53 and a projection end face part 57 vertical to this locking surface part 53. The projection end face part 57 is a face portion in which the lock claw 51 is projected from the plate surface 55 of the lock piece 47 in a direction of plate thickness t. In the embodiment, this edge part 59 has a cross section of an acute angle.

At least the lock piece 47 (the right lock piece in FIG. 3B), nearest to the operation part 45, of these lock pieces 47 is formed with a taper part 61. The taper part 61 is formed by notching an operation part side of the edge part 59 located between the locking surface part 53 and the projection end face part 57 vertical to this locking surface part 53 gradually larger toward the operation part 45.

The taper part 61 has a plane of substantially an isosceles triangle as shown in FIG. 4A. In the embodiment, the taper part 61 is formed in substantially a half region of a plate width W of the lock claw 51. That is, the lock claw 51 of FIG. 4A has the edge part 59 in the left half, and has the taper part 61 in the right half.

The fuse cover 13 is held in the fuse unit 11 using locking parts located at three vertical angles of a triangle by the three lock pieces 47. The operation part 45 is arranged in the fuse cover 13 in proximity to one of the three lock pieces 47. In the lock piece 47 proximal to the operation part 45, the taper part 61 is formed on the lock claw 51 of the operation part side.

The fuse cover 13 is formed of a soft resin, thus enabling a certain level of deformation. With the fuse cover 13 supported by the three lock pieces 47, the vicinity of one of the three lock pieces 47 is pulled up by the operation part 45. Then, the lock piece 47 arranged in the vicinity is also displaced in a pull-up direction. This displacement is due to torsional deformation in a three-dimensional direction. The lock piece 47 in the vicinity of the operation part 45 is constructed so that the taper part 61 of the lock claw 51 tends to make sliding contact with the locked surface part 31 by this torsional deformation and swing rotation of the fuse cover 13. The lock piece 47, in which the taper part 61 of the lock claw 51 makes sliding contact with the locked surface part 31, is subjected to a reaction force from the locked surface part 31, and the lock piece 47 can easily be separated (peeled) from the locked surface part 31.

By providing the lock claw 51 with the taper part 61, the taper part 61 can smoothly be brought into sliding contact with the locked surface part 31, and damage to the lock piece 47 at the time of an opening operation of the fuse cover 13 is also prevented.

The fuse unit 11 including the cover locking structure of the electrical junction box according to the embodiment is mounted in the fuse box 15. The fuse unit 11 is arranged in an upper support wall part 63 (see FIG. 2B) of the fuse box 15. The upper support wall part 63 of the fuse box 15 is formed with a peripheral wall 65 which surrounds the fuse unit 11 in proximity to at least one (the first side wall 39 in the embodiment) of the first side wall 39 and the second side wall 41 of the fuse cover 13. An outer surface of the peripheral wall 65 is arranged as opposed to the battery 17.

Next, action of the configuration mentioned above will be described.

Figure 5A:
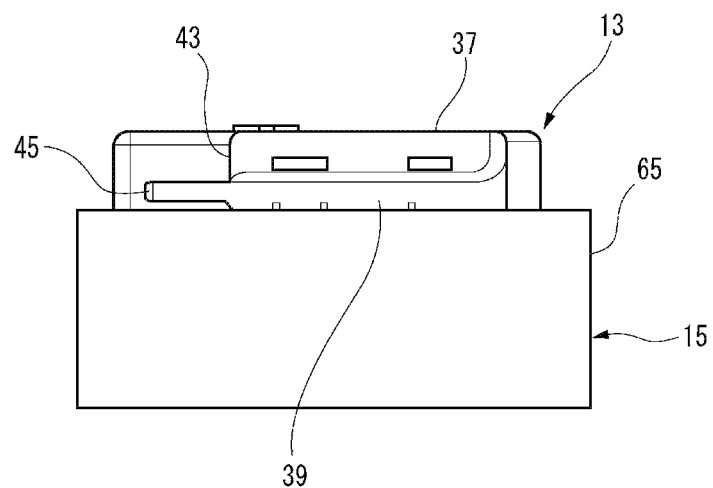
FIG. 5A is a side view of the electrical junction box with the cover attached.
Figure 5B:
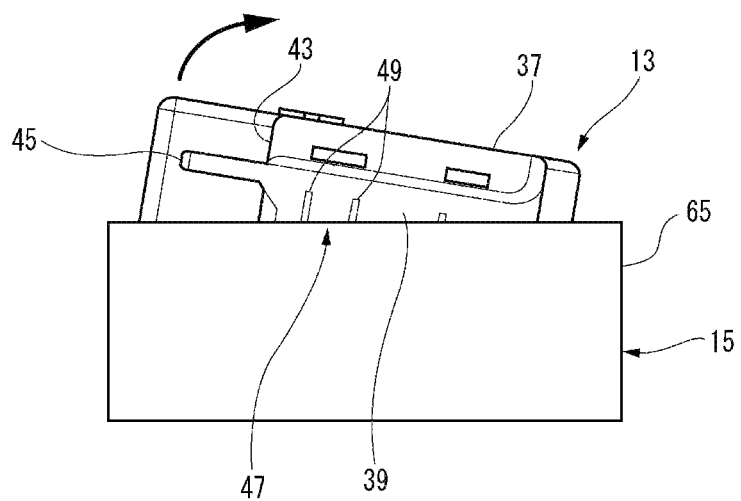
FIG. 5B is a side view of the electrical junction box during detachment of the cover.
Figure 6A:
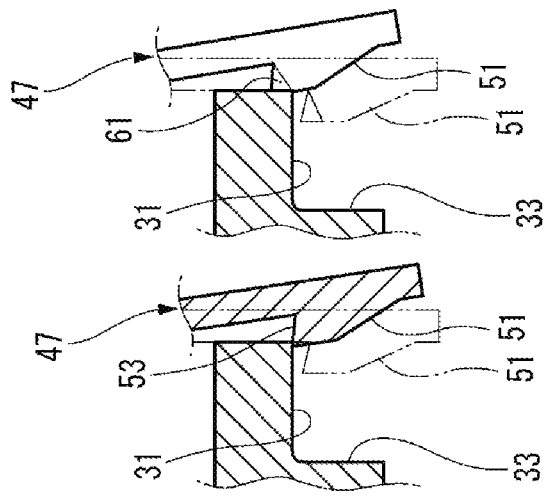
FIG. 6A is an operation explanatory diagram at the time of a normal lock.
Figure 6B:
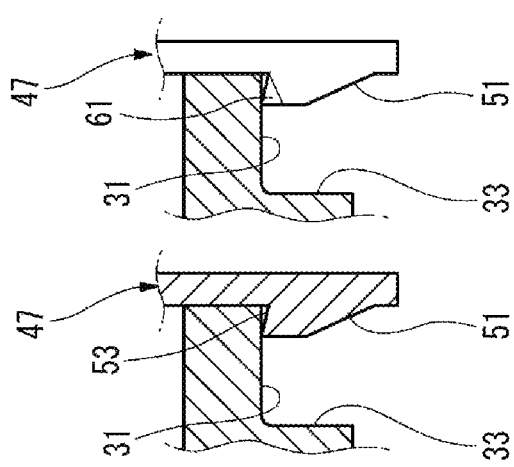
FIG. 6B is an operation explanatory diagram at the time of causing a load by a perpendicular stress.
Figure 6C:
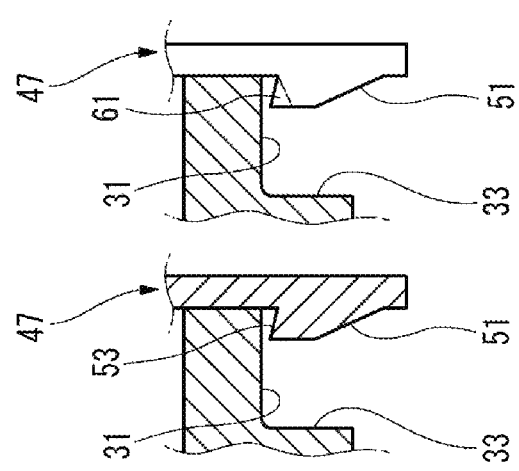
FIG. 6C is an operation explanatory diagram at the time of an opening operation.

FIG. 5A is a side view of the fuse box 15 with the fuse cover 13 attached, and FIG. 5B is a side view of the fuse box 15 during detachment of the fuse cover 13. FIGS. 6A to 6C is a diagram showing both of an operation part side and a counter-operation part side of the lock pieces 47. FIG. 6A is an operation explanatory diagram at the time of a normal lock, and FIG. 6B is an operation explanatory diagram at the time of causing a load by a perpendicular stress, and FIG. 6C is an operation explanatory diagram at the time of an opening operation.

In the cover locking structure of the electrical junction box according to the embodiment, as shown in FIG. 5A, attachment of the fuse cover 13 to the fuse unit 11 changes to a normal lock state, and the covered surface 25 of the fuse unit 11 is covered with the fuse cover 13.

As shown in FIG. 6A, at the time of the normal lock, the locking surface parts 53 of the lock pieces 47 respectively formed on the first side wall 39 and the second side wall 41 are locked into the respective locked surface parts 31 of the fuse unit 11, thereby attaching the fuse cover 13 to the fuse unit 11. The respective lock pieces 47 are formed with the lock pieces 47 locked into the locked surface parts 31 by the parallel or acute-angled locking surface parts 53. The lock pieces 47 are locked into the locked surface parts 31 by the locking surface parts 53, thereby fixing (locking) the fuse cover 13 to the fuse unit 11 in a holding state.

At least the lock piece 47 (the right lock piece in FIG. 3B), nearest to the operation part 45, of the plurality of lock pieces 47 is formed with the taper part 61. The taper part 61 is formed by notching the operation part side of the edge part 59 located between the locking surface part 53 and the projection end face part 57 vertical to this locking surface part 53 gradually larger toward the operation part 45. At the time of the normal lock, the locking surface part 53 of the lock piece 47 is separated so as to have a slight clearance between the locked surface part 31 and the locking surface part 53. This clearance is set in order to smoothly lock the locking surface part 53 into the locked surface part 31 and unlock the locking surface part 53 from the locked surface part 31. In this state, the taper part 61 is arranged in a position further separated from the locked surface part 31 than the locking surface part 53.

As shown in FIG. 6B, in a vehicle-mounted state, an external force acts on the electrical junction box by vibration etc., and a load by a perpendicular stress is caused on the fuse cover 13. Then, the fuse cover 13 is moved in a direction separated from the fuse unit 11. In the fuse cover 13 moved in the direction separated from the fuse unit 11, the locking surface part 53 of the lock piece 47 abuts on the locked surface part 31 of the fuse unit 11, and further movement (that is, opening of the fuse cover 13) is regulated. Also in this state, the taper part 61 is arranged in the position separated from the locked surface part 31. Accordingly, the lock piece 47 can achieve a sure locking state in which the locking surface part 53 is locked into the locked surface part 31 like a conventional structure.

On the other hand, in the fuse cover 13, at the time of the opening operation, the operation part 45 is operated as shown in FIG. 5B. When the operation part 45 of the fuse cover 13 is pulled up in a direction of detachment of the fuse cover 13, the taper part 61 of the lock piece 47 of the operation part side abuts on the locked surface part 31 in a process in which the locking surface part 53 is subjected to a reaction force from the locked surface part 31. This is because the taper part 61 is continuously formed on the edge part 59 of the operation part side, and the taper part 61 is arranged on the outermost side of a swing radius by swing of the fuse cover 13 through operation of the operation part 45, and the torsional deformation in the three-dimensional direction described above is caused.

As a result, when the operation part 45 is further pulled up, the lock piece 47 of the operation part side is subjected to a component force in a direction separated from the locked surface part 31 by the taper part 61, and flexes to be separated from the locked surface part 31 as shown in FIG. 6C. As a result, in the lock piece 47 of the operation part side, the locking surface part 53 is unlocked from the locked surface part 31. In this case, the taper part 61 contributes also to a decrease in an unlocking force in the case of unlocking.

Further, the taper part 61 formed on a part of the edge part 59 minimizes a decrease in a holding force in a vertical direction, which is contradictory to the decrease in the unlocking force.

Also, in the fuse cover 13, one lock piece 47 (the lock piece 47 of the operation part side formed on the first side wall 39) in the first side wall 39 and the second side wall 41 mutually in parallel is unlocked, thereby being able to easily unlock the other lock piece 47 (the lock piece 47 formed on the second side wall 41). In the fuse cover 13 with the lock pieces 47 of the first side wall 39 and the second side wall 41 unlocked, a locking part of the lock piece 47 of the counter-operation part side forms a rotation fulcrum, and the operation part 45 forms the distal end of swing, and the fuse cover 13 comes up from the fuse unit 11. In the fuse cover 13 with the top wall 37 inclined to the covered surface 25, the locking surface part 53 of the lock piece 47 of the other counter-operation part side can easily be unlocked from the locked surface part 31, and the fuse cover 13 is detached from the fuse unit 11.

As a result, the fuse cover 13 can be detached by only pull-up movement of the operation part 45 using fingers of one hand. Accordingly, the cover locking structure of the electrical junction box according to the embodiment eliminates the need for space for a worker to put worker's hands for unlocking by pushing the opposed locking parts in a separation direction by both hands of the worker, on the periphery of the fuse cover 13 like the conventional structure.

That is, the cover locking structure of the electrical junction box according to the embodiment can easily detach the fuse cover 13 from the fuse unit 11 even in a place without peripheral space due to, for example, installation into the fuse box 15 or density of peripheral components.

Also, in the cover locking structure of the electrical junction box according to the embodiment, the fuse unit 11 is mounted inside the fuse box 15. The fuse box 15 is formed with the peripheral wall 65 which surrounds the fuse unit 11. In the fuse unit 11 surrounded by the peripheral wall 65, the first side wall 39 is in proximity to the peripheral wall 65. That is, the fuse box 15 can decrease a distance between the first side wall 39 and the peripheral wall 65 to mount the fuse unit 11. Consequently, the fuse box 15 can effectively be used for a component layout which does miniaturization by arranging the fuse unit 11 and the operation part 45 in proximity to the peripheral wall 65.

In the cover locking structure of the electrical junction box according to the embodiment, the fuse unit 11 and the operation part 45 can be arranged in proximity to the battery 17 when the fuse box 15 is attached in proximity to the battery 17. In the cover locking structure of the electrical junction box according to the embodiment, by using the electrical junction box as the fuse box 15 and using the covered body as the fuse unit 11 and using the cover as the fuse cover 13 like the embodiment, space necessary for work of detaching the fuse cover 13 from the fuse box 15 is compactified, and the work of detaching the fuse cover 13 can easily be done.

Accordingly, the cover locking structure of the electrical junction box according to the embodiment eliminates the need for space for a worker to put worker's hands for unlocking in the case of work of detaching the cover, on the periphery of the fuse cover 13.

The invention is not limited to the embodiment described above, and modifications, improvements, etc. can be made properly. Moreover, for example, materials, shapes, dimensions, arrangement places, the number of components in the embodiment described above can be freely selected and are not limited as long as the invention can be achieved.

For example, in the configuration example described above, the taper part 61 is formed on only the lock piece 47 in proximity to the operation part 45, but the taper part 61 may be further formed on the lock claw 51 of the operation part side of the other lock piece 47. By forming the taper parts 61 on the plurality of lock pieces 47, the capability of detaching the fuse cover 13 by the operation part 45 is more improved without decreasing holding performance by similar action described above.

In accordance with the embodiments, a cover locking structure of an electrical junction box includes a covered body 11 and a cover 13. The covered body 11 includes a first side surface part 27 which is perpendicular to a covered surface 25 of the covered body 11. The covered body 11 also includes a second side surface part 29 which is parallel to the first side surface 27. In addition, the covered body 11 includes at least one locked surface part 31 which is provided on each of the first side surface part 27 and the second side surface part 29 and is parallel to the covered surface 25. The cover 13 includes a first side wall 39 which is extended from a top wall 37 configured to cover the covered surface 25 and is opposed to the first side surface part 27. The cover 13 also includes a second side wall 37 which is extended from the top wall 37 and is opposed to the second side surface part 29. The cover 13 also includes an operation part 45 projected on a third side wall 43 between the first side wall 39 and the second side wall 41. Moreover, the cover 13 includes a plurality of lock pieces 47 provided on the first side wall 39 and the second side wall 41, each of the plurality of lock pieces 47 includes a locking surface part 53 to be locked with a corresponding one of the locked surface parts 31. A lock piece 47 which is nearest to the operation part 45 among the plurality of lock pieces 47 has a taper part 61 formed by notching an operation part side of an edge part 59 gradually larger toward the operation part 45, the edge part 59 being located between the locking surface part 53 and a projection end face part 57 perpendicular to the locking surface part 53.

According to the cover locking structure, the covered surface of the covered body is covered with the cover by attaching the cover to the covered body. The locking surface part of the lock piece formed on each of the first side wall and the second side wall is locked into each of the locked surface parts of the covered body, thereby attaching the cover to the covered body. At least the lock piece, nearest to the operation part, of the plurality of lock pieces is formed with the taper part. When the operation part of the cover is pulled up in a direction of detachment of the cover, this taper part abuts on the locked surface part. When the operation part is further pulled up, the lock piece is subjected to a component force in a direction separated from the locked surface part by the taper part, and flexes to be separated from the locked surface part. As a result, in the lock piece, the locking surface part is unlocked from the locked surface part. In the cover, one lock piece in the first side wall and the second side wall mutually in parallel is unlocked, thereby being able to easily unlock the other lock piece. As a result, the cover can be detached by only pull-up movement of the operation part using fingers of one hand. Accordingly, the cover locking structure of the electrical junction box with the present configuration eliminates the need for space for a worker to put worker's hands for unlocking by pushing the opposed locking parts in a separation direction by both hands of the worker, on the periphery of the cover like a conventional structure.

In the cover locking structure, the covered body 11 may be mounted in an electrical junction box 15 having a peripheral wall 65 which surrounds the covered body 11 in proximity to at least one of the first side wall 39 and the second side wall 41 of the cover 13.

According to this structure, the covered body is mounted inside the electrical junction box. The electrical junction box is formed with the peripheral wall which surrounds the covered body. In the covered body surrounded by the peripheral wall, at least one of the first side wall and the second side wall is in proximity to the peripheral wall. That is, the electrical junction box can decrease a distance between the peripheral wall and at least one of the first side wall and the second side wall to mount the covered body. Consequently, the electrical junction box can effectively be used for a component layout which does miniaturization by arranging the covered body and the operation part in proximity to the peripheral wall.

In the cover locking structure, one outer surface of the peripheral wall 65 of the electrical junction box 15 may be arranged as opposed to a battery 17

According to this structure, the covered body and the operation part can be arranged in proximity to the battery when the electrical junction box is attached in proximity to the battery. In the cover locking structure of the electrical junction box with the present configuration, for example, the electrical junction box can be used as the fuse box, and the covered body can be used as the fusible link unit, and the cover can be used as the fuse cover. In this case, space necessary for work of detaching the fuse cover from the fuse box is compactified, and the work of detaching the fuse cover can easily be done.

The cover locking structure of the electrical junction box according to the embodiments eliminates the need for space for a worker to put worker's hands for unlocking in the case of work of detaching the cover, on the periphery of the cover.

DESCRIPTION OF REFERENCE NUMERALS AND SIGNS

11 ... FUSE UNIT (COVERED BODY)
13 ... FUSE COVER (COVER)
15 ... FUSE BOX (ELECTRICAL JUNCTION BOX)
17 ... BATTERY
25 ... COVERED SURFACE
27 ... FIRST SIDE SURFACE PART
29 ... SECOND SIDE SURFACE PART
31 ... LOCKED SURFACE PART
37 ... TOP WALL
39 ... FIRST SIDE WALL
41 ... SECOND SIDE WALL
43 ... THIRD SIDE WALL
45 ... OPERATION PART
47 ... LOCK PIECE
53 ... LOCKING SURFACE PART
57 ... PROJECTION END FACE PART
59 ... EDGE PART
61 ... TAPER PART
65 ... PERIPHERAL WALL

What is claimed is:

1. A cover locking structure of an electrical junction box, the cover locking structure comprising:
   a covered body; and
   a cover,
   wherein the covered body includes:
      a first side surface part which is perpendicular to a covered surface of the covered body;
      a second side surface part which is parallel to the first side surface; and
      at least one locked surface part which is provided on each of the first side surface part and the second side surface part and is parallel to the covered surface,
   wherein the cover includes:
      a first side wall which is extended from a top wall configured to cover the covered surface and is opposed to the first side surface part;
      a second side wall which is extended from the top wall and is opposed to the second side surface part;
      an operation part projected on a third side wall between the first side wall and the second side wall; and
      a plurality of lock pieces provided on the first side wall and the second side wall, wherein each of the plurality of lock pieces includes a locking surface part to be locked with a corresponding one of the locked surface parts, and
   wherein a lock piece which is nearest to the operation part among the plurality of lock pieces has a taper part formed by notching an operation part side of an edge part gradually larger toward the operation part, the edge part being located between the locking surface part and a projection end face part perpendicular to the locking surface part.

2. The cover locking structure according to claim 1, wherein the covered body is mounted in an electrical junction box having a peripheral wall which surrounds the covered body in proximity to at least one of the first side wall and the second side wall of the cover.

3. The cover locking structure according to claim 2, wherein one outer surface of the peripheral wall of the electrical junction box is arranged as opposed to a battery.

* * * * *